US006190929B1

(12) United States Patent
Wang et al.

(10) Patent No.: US 6,190,929 B1
(45) **Date of Patent: *Feb. 20, 2001**

(54) METHODS OF FORMING SEMICONDUCTOR DEVICES AND METHODS OF FORMING FIELD EMISSION DISPLAYS

(75) Inventors: Dapeng Wang; James Hofmann, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/360,193

(22) Filed: Jul. 23, 1999

(51) Int. Cl.[7] .................................................... H01L 21/00

(52) U.S. Cl. ................................ 438/20; 438/22; 438/30

(58) Field of Search .................................. 438/30, 20, 22

(56) References Cited

U.S. PATENT DOCUMENTS 5,509,840 * 4/1996 Huang et al. .

OTHER PUBLICATIONS

Stephen Y. Chou et al.; "Sub–10 nm imprint lithography and applications"; J. Vac. Sci. Technol. B, vol. 15, No. 6, Nov./Dec. 1997; pp. 2897–2904.

Heidari, B. et al., "Large Scale Nanolithography Using Nanoimprint Lithography", J. Vac. Sci. Technol. B 17(6), Nov./Dec. 1999, pp. 2961–2964.

Wang, J. et al., "Fabrication of a New Broadband Waveguide Polarizer with a Double–Layer 190 nm Period Metal–Gratings Using Nanoimprint Lithography", J. Vac. Sci. Technol. B 17(6), Nov./Dec. 1999, pp. 2957–2960.

Ruchhoeft, P. et al., "Patterning Curved Surfaces: Template Generation by Ion Beam Proximity Lithography and Relief Transfer by Step and Flash Imprint Lithography", J. Vac. Sci. Technol. B 17(6), Nov./Dec. 1999, pp. 2965–2969.

Haisma, J. et al., "Mold–Assisted Nanolithography: A Process for Reliable Pattern Replication" J. Vac. Sci. Technol. B 14(6), Nov./Dec. 1996, pp. 4124–4128.

* cited by examiner

*Primary Examiner*—Kevin M. Picardat
*Assistant Examiner*—D. M. Collins
(74) *Attorney, Agent, or Firm*—Wells, St. John, Roberts, Gregory & Matkin P.S.

(57) ABSTRACT

In one aspect, the invention encompasses a method of forming a semiconductor device. A masking material is formed over a semiconductor substrate. A mold is provided, and the mold has a first pattern defined by projections and valleys between the projection. The masking material is pressed between the mold and the substrate to form a second pattern in the masking material. The second pattern is substantially complementary to the first pattern. The mold is removed from the masking material, and subsequently the masking material is utilized as a mask during etching of the semiconductor substrate. In another aspect, the invention encompasses a method of forming a field emission display. A first material layer is formed over a conductive substrate, and a masking material is formed over the first material layer. A mold is provided over the mask material, and the mask material is pressed between the mold and the first material layer to pattern the masking material. The pattern is transferred from the masking material to the first material layer. The patterned first material layer is then used as a second mask, and the conductive substrate is etched to form a plurality of conically shaped emitters. A display screen is formed in a spaced relation to such emitters.

29 Claims, 5 Drawing Sheets

METHODS OF FORMING SEMICONDUCTOR DEVICES AND METHODS OF FORMING FIELD EMISSION DISPLAYS

PATENT RIGHTS STATEMENT

This invention was made with Government support under Contract No. DABT63-97-C-0001 awarded by Advanced Research Projects Agency (ARPA). The Government has certain rights in this invention.

TECHNICAL FIELD

The invention pertains to methods of forming semiconductor devices, such as, for example, cathode emitter tips for electron emission devices. In particular applications, the invention pertains to methods of forming a patterned mask by pressing a pliable masking material with a mold.

BACKGROUND OF THE INVENTION

Electron emission devices include display devices wherein electrons are emitted from cathode emitter tips toward phosphor molecules (the phosphor molecules can also be referred to herein as simply "phosphor"). An exemplary display device is a Field Emission Display (FED) device, such as the prior art FED device 10 described with reference to FIG. 1.

Device 10 comprises a baseplate assembly 12 and a faceplate assembly 14. Baseplate assembly 12 includes a substrate 16. Substrate 16 is preferably formed of an insulative glass material, and can be referred to as a baseplate. Column interconnects 18 are patterned over substrate 16. Column interconnects 18 comprise a conductive material, such as, for example, a metal. In preferred applications, column interconnects comprise an assembly of three sub-layers, with the sub-layers being an aluminum layer elevationally between a pair of chromium layers.

A buffer layer 19 is formed over column interconnects 18, and a resistor layer 20 is formed over buffer layer 19. Buffer layer 19 comprises amorphous or microcrystalline silicon, and resistor layer 20 comprises conductively-doped amorphous silicon (preferably, boron-doped amorphous silicon).

Electron emission tips 22 are formed over substrate 16 at sites from which electrons are to be emitted, and can be constructed from conductively doped silicon (the silicon can be in, for example, either an amorphous or polycrystalline form). Emission tips 22 can have a number of pointed geometries, including, for example, pyramids and cones.

An extraction grid 24 (also referred to as a gate) is formed proximate emitter tips 22, and separated from substrate 16 with a dielectric layer 26. Extraction grid 24 comprises a conductive material, such as, for example, conductively doped polysilicon. Extraction grid 24 is patterned to have openings 28 extending therethrough to expose electron emission tips 22. Dielectric layer 26 electrically insulates extraction grid 24 from electron emission tips 22, and the associated column interconnects 18.

Faceplate assembly 14 of FED device 10 is provided in a spaced relation relative to baseplate assembly 12, and is held in such spaced relation by insulative spacers 38.

Faceplate assembly 14 comprises a transparent substrate 36, and a transparent anode 34 formed proximate substrate 36. Substrate 36 can be referred to as a faceplate. Anode 34 can comprise, for example, indium tin oxide, and substrate 36 can comprise, for example, glass.

Faceplate assembly 14 comprises phosphor 32 supported by substrate 36 and defining pixels. Phosphor 32 comprises a luminescent material that generates visible light upon being excited by electrons emitted from electron emission tips 22. Phosphor 32 can comprise, for example, red/green/blue phosphor triads.

A voltage source 30 is provided to generate an operating voltage differential between electron emission tips 22, grid structure 24, and anode 34. One or more of emitter tips 22 can then be electrically stimulated to cause electrons 40 to be emitted toward phosphor 32. The impact of electrons 40 with phosphor 32 causes luminescence of phosphor 32. A person looking through transparent substrate 36 can see such luminescence. Accordingly, electron emission from emitter tips 22 is converted to an image visible through faceplate assembly 16.

Clarity, or resolution, of a field emission display is a function of a number of factors, including emitter tip uniformity and sharpness. Accordingly, numerous methods have been proposed for fabrication of very sharp emitter tips (i.e., emitter tips having tip radii of 100 nanometers or less), uniformly spaced across an array. Fabrication of very sharp and appropriately spaced tips has, however, proved difficult. In light of these difficulties, it would be desirable to develop alternative methods of forming emitter tips.

SUMMARY OF THE INVENTION

In one aspect, the invention encompasses a method of forming a semiconductor device. A masking material is formed over a semiconductor substrate. A mold is provided, and the mold has a first pattern defined by projections and valleys between the projection. The masking material is pressed between the mold and the substrate to form a second pattern in the masking material. The second pattern is substantially complementary to the first pattern. The mold is removed from the masking material, and subsequently the masking material is utilized as a mask during etching of the semiconductor substrate.

In another aspect, the invention encompasses a method of forming a field emission display. A first material layer is formed over a conductive substrate, and a masking material is formed over the first material layer. A mold is provided over the mask material, and the mask material is pressed between the mold and the first material layer to pattern the masking material. The pattern is transferred from the masking material to the first material layer. The patterned first material layer is then used as a second mask, and the conductive substrate is etched to form a plurality of conically shaped emitters. A display screen is formed in a spaced relation to such emitters.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In one aspect, the invention encompasses a method of forming cathode emitter tips for an electron emission device. Such methodology utilizes a mold to pattern a masking layer, and subsequently comprises transferring a pattern from the masking layer to a conductive material to form cathode emitter tips from the conductive material. An exemplary method of the present invention is described with reference to FIGS. 2–10.

Figure 2:
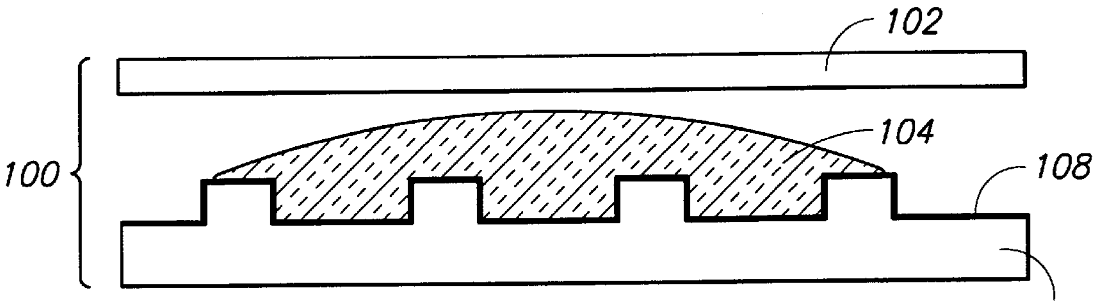
FIG. 2 is a diagrammatic, cross-sectional view of a mold being prepared in accordance with a method of the present invention.
Figure 3:
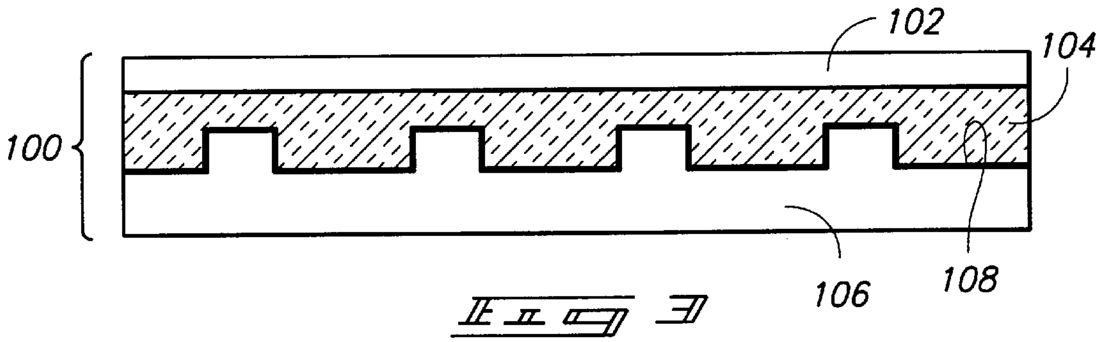
FIG. 3 is a view of the FIG. 2 mold shown at a mold-preparation step subsequent to that of FIG. 2.

Referring initially to FIGS. 2–3, a mold is formed. Specifically, FIG. 2 illustrates an assembly 100 comprising a pressing disk 102, a silicon rubber material 104, and a master mold 106. Silicon rubber 104 is provided in a non-cured form. An exemplary silicon rubber monomer is Type J silicon rubber available from Dow Corning Company of Midland, Mich.

In preferred embodiments of the invention, a release agent layer 108 is provided between silicon rubber material 104 and master mold 106. Releasing agent 108 can comprise, for example, KRYLON™, which is an industrial mold release agent available from Borden Company of Columbus, Ohio. Releasing agent 108 can simplify removal of silicon rubber material 104 from master mold 106.

Referring to FIG. 3, pressing disk 102 is moved downwardly to press silicon rubber material 104 between disk 102 and mold 106. Such disperses silicon rubber material 104 across peaks and valleys of mold 106 and accordingly forms a pattern within material 104 which is complementary to the pattern of peaks and valleys of the surface of mold 106. Silicon rubber material 104 is then cured. Such curing can be accomplished by, for example, leaving the material at room temperature for 48 hours.

Figure 4:
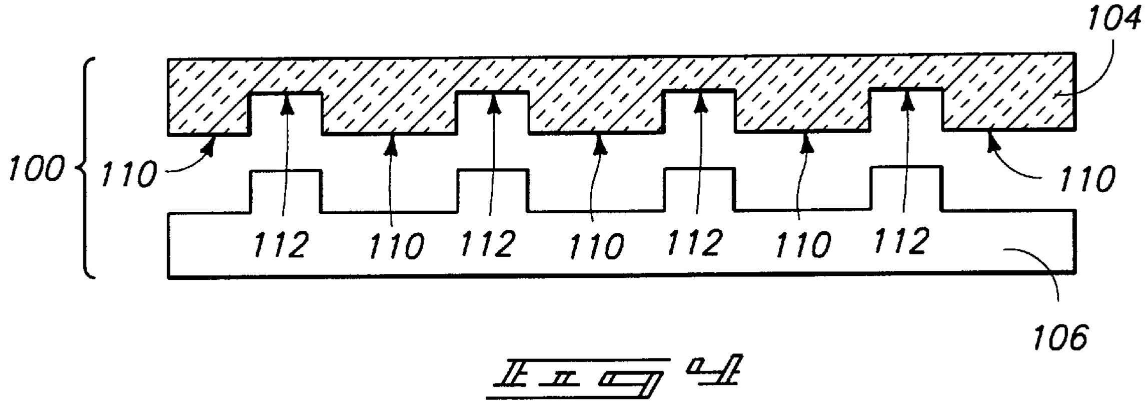
FIG. 4 is a view of the FIG. 2 mold shown at a mold-preparation step subsequent to that of FIG. 3.

After the silicon rubber material is cured, it can be removed from master mold 106 as shown in FIG. 4. Cured material 104 now comprises a pattern across its surface. Such pattern is defined by peaks 110 and valleys 112 between the peaks. The pattern of peaks 110 and valleys 112 can be referred to as a first pattern in the description that follows.

It is noted that the above-described processing for forming cured mold 104 is an exemplary processing method, and that other methodologies are, of course, contemplated by the present invention. For instance, processing disk 102 is an optional aspect of the invention. In particular embodiments, uncured material 104 can have a low enough viscosity such that the material flows evenly across the surface of mask mold 106, and uniformly fills cavities associated with a surface of master mold 106 without being pressed. Also, although material 104 is described as a silicon rubber material, it will be recognized that other materials can be utilized. For instance, molten metals could be utilized for material 104, and flowed across a surface of master mold 106. The metals could then be cooled to form a solid having the pattern defined by projections 110 and valleys 112. Alternatively, material 104 could comprise a hardened polymer, such as an epoxy, which is flowed onto mold 106 as a liquid and subsequently cured to form a solid having projections 110 and valleys 112. If an epoxy is utilized, such epoxy could be either light curable, or temperature curable. In yet another aspect of the invention, material 104 could comprise a plastic which is melted and flowed over master mold 106, and subsequently cooled to form a solid material having the pattern defined by projections 110 and valleys 112.

Figure 5:
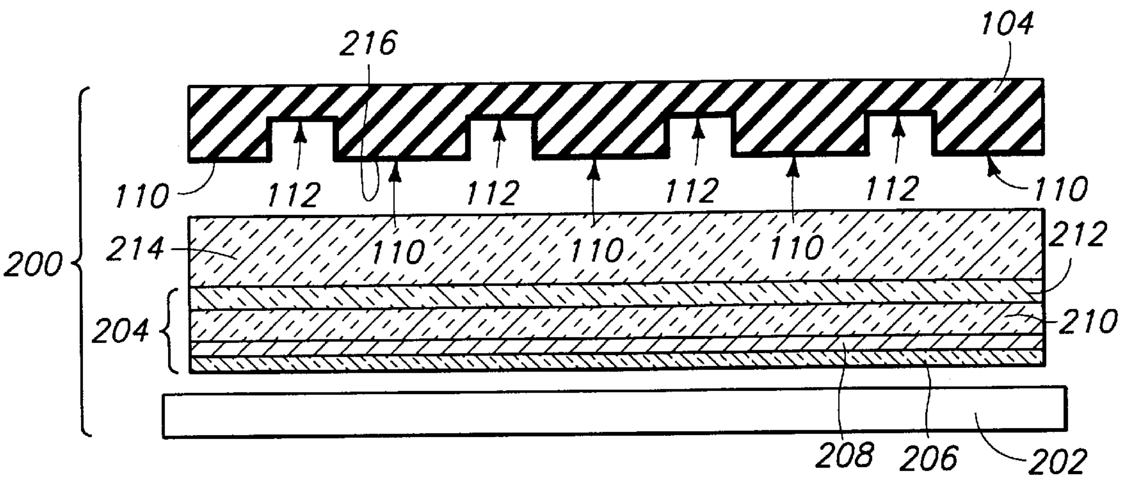
FIG. 5 is a diagrammatic, cross-sectional view of a semiconductor substrate being processed in accordance with the present invention.

A method of utilizing the mold of FIGS. 2–4 for forming cathode emitter tips is described with reference to FIGS. 5–10. Referring to FIG. 5, an assembly 200 comprises silicon rubber mold 104, a support 202 and a semiconductor substrate 204 over support 202. Semiconductor substrate 204 comprises a bottom layer 206 of glass, an first intermediate layer 208, a second intermediate layer 210, and an upper layer 212.

Glass layer 206 can comprise, for example, a glass having the construction described above with reference to material 16 of FIG. 1.

First intermediate layer 208 can comprise, for example, the conductive, insulative, and resistive materials 18, 19 and 20 described above with reference to FIG. 1, and second intermediate layer 210 can comprise conductively doped silicon. Such doped silicon can comprise one or both of amorphous and polycrystalline forms of silicon, and can be doped with either n-type or p-type dopant to a concentration of $10^{19}$ dopant atoms/$cm^3$ or greater.

Upper layer 212 can be referred to in the discussion that follows as a first material layer, and preferably comprises a material to which conductively doped silicon 210 can be selectively etched. A suitable material for layer 212 is silicon dioxide.

The composition of layers 206, 208, 210 and 212 is referred to as a semiconductor substrate 204 because such composition comprises semiconductive materials. It is noted that the composition consisting of layers 206, 208 and 210 can also be referred to as a semiconductor substrate. To aid in interpretation of this disclosure and the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Assembly 200 further comprises a layer 214 of masking material formed over layer 212. Such masking material preferably comprises a material that is relatively pliable under a first condition and relatively solid under a second condition. For instance, the masking material can comprise a thermoplastic material, with the term "thermoplastic material" being defined as any plastic-like material which flows when heated. Accordingly, the masking material can comprise a material which is relatively pliable at a first temperature and relatively solid at a second temperature. A specific material suitable for methodology of the present invention is EPON SU8™, which is available from the Shell Chemical Company of Houston, Tex. EPON SU8™ is known in the industry to be suitable for utilization as a photoresist when a photo-initiator is added. In the present invention, EPON SU8™ is utilized for its thermoplastic properties, rather than its photoresist properties.

As discussed above regarding FIGS. 1–3, mold 104 comprises a patterned surface which includes projections 110 and valleys 112 between the projections. The pattern of such surface can be referred to as a first pattern. A release layer 216 is shown applied over the patterned surface of mold 104. Release layer 216 can comprise, for example, a lubricant. An exemplary material for release layer 216 is KRYLON™.

Figure 6:
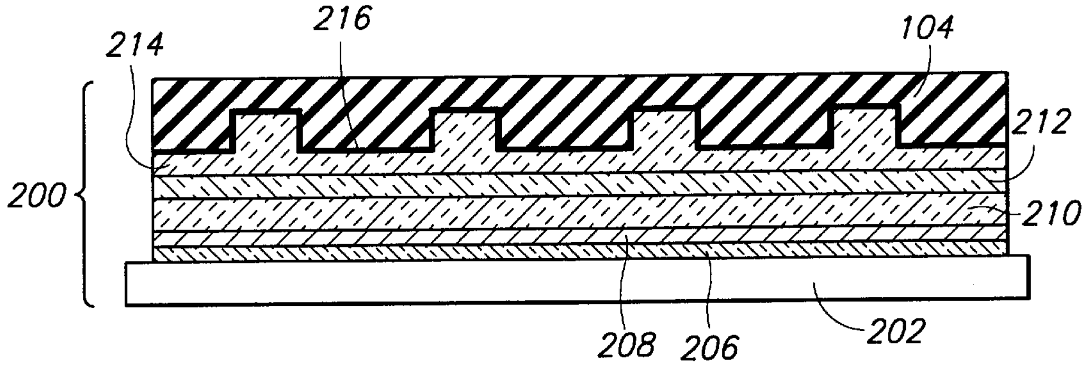
FIG. 6 is a view of the FIG. 5 semiconductor substrate shown at a processing step subsequent to that of FIG. 5.

Referring to FIG. 6, masking material layer 214 is pressed between mold 104 and support 202 to form a second pattern in layer 214. Such second pattern is substantially complementary to the first pattern of mold 104. By substantially complementary, it is meant that the second pattern has a general shape corresponding to the complement of the first pattern of mold 104, but can have variations introduced due to, for example, imperfections in the uniformity of distribution of masking material 214 about the interface of mold 104 and layer 214. Such imperfections can be caused by, for example, small gas bubbles.

Masking material layer 214 adopts a shape complementary to the first pattern of mold 104 due to the material of layer 214 being in a relatively pliable state. If such material comprises a thermoplastic material, it is preferably heated to a temperature wherein the material is relatively pliable. In such embodiments, support 202 can comprise a thermally conductive material. Such material can be heated, and the heat transferred from support 202 to substrate 204 and ultimately to masking material layer 214 to heat the masking material to a temperature where the material becomes pliable. In an exemplary application wherein the masking material comprises EPON SU8™, such temperature at which the masking material becomes pliable can comprise, for example, a temperature of greater than about 83° C.

Figure 7:
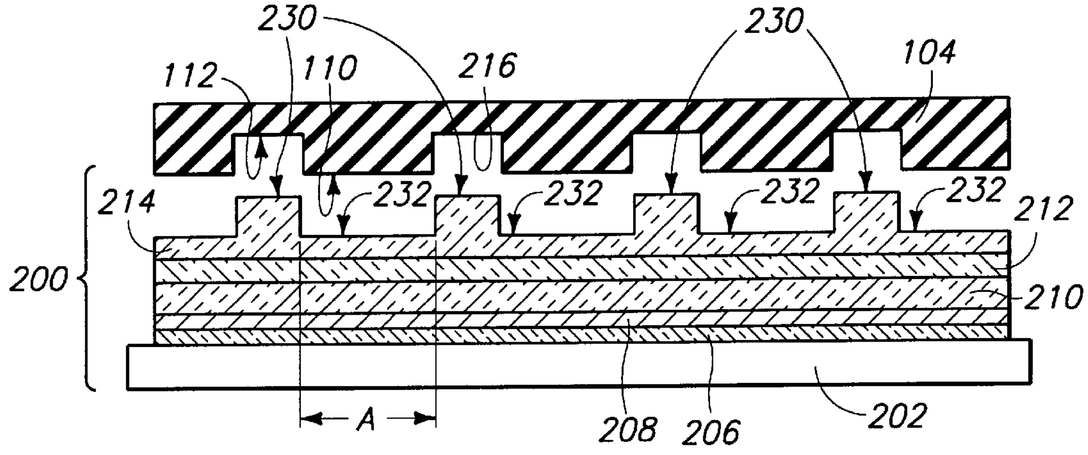
FIG. 7 is a view of the FIG. 5 semiconductor substrate shown at a pressing step subsequent to that of FIG. 6.

After the second pattern is formed in masking material 214, the material is subjected to conditions under which the material becomes less pliable. In exemplary applications wherein the material of layer 214 comprises a thermoplastic material, the conditions which make the material less pliable can comprise cooling the material to a lower temperature. For instance, if the material of layer 214 comprises EPON SU8™, suitable conditions can comprise cooling material to a temperature of at or below about 30° C., such as, for example, a temperature of from about 20° C. to about 30° C. The material then becomes substantially solid and mold 104 can be lifted from the material as shown in FIG. 7. As shown, layer 214 retains a surface having a shape in the second pattern even after mold 104 is lifted and removed. Such second pattern comprises projections 230 complementary to the valleys 112 of mold 104 and valleys 232 complementary to the peaks 110 of mold 104. A distance "A" corresponds to a distance between an edge of a projection 230 and a corresponding edge of an adjacent projection 230.

Figure 8:
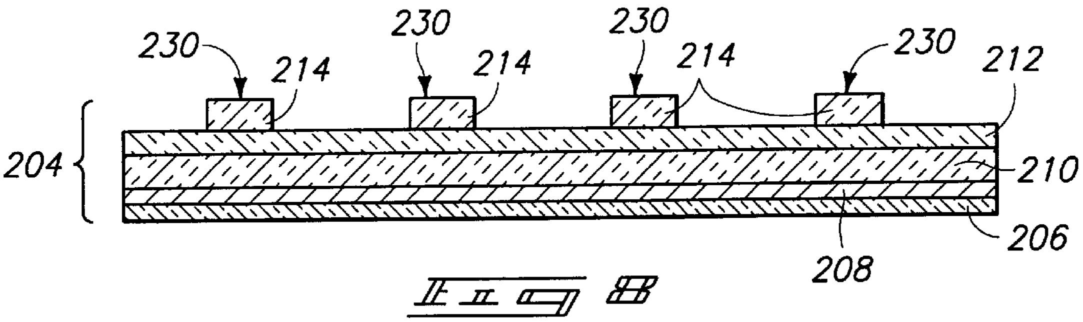
FIG. 8 is a view of the FIG. 5 semiconductor substrate shown at a processing step subsequent to that of FIG. 7.

Referring to FIG. 8, substrate 204 is subjected to reactive ion etching which removes material of layer 214 from valleys 232 to leave layer 212 exposed between peaks 230 of the remaining material of layer 214. A suitable reactive ion etch utilizes $O_2$/He and plasma.

Figure 9:
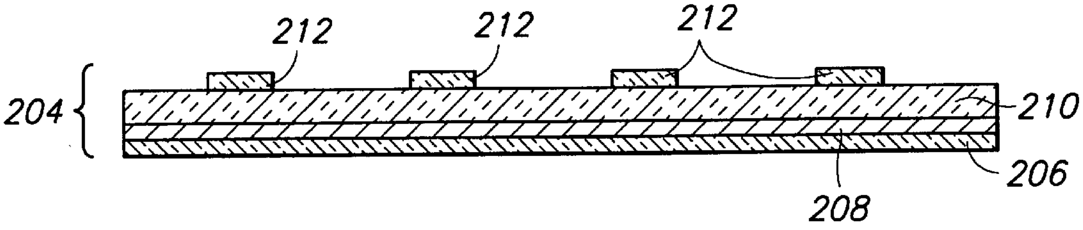
FIG. 9 is a view of the FIG. 5 semiconductor substrate shown at a processing step subsequent to that of FIG. 8.

Referring to FIG. 9, the pattern of material 214 is transferred to layer 212, and subsequently, layer 214 is stripped from over layer 212. In embodiments in which layer 212 comprises silicon dioxide, the pattern can be transferred from layer 214 to layer 212 by a silicon dioxide dry etch. If layer 214 comprises EPON SU8™, such can be removed from over layer 212 by, for example, a strip utilizing $O_2$/He and plasma.

Figure 10:
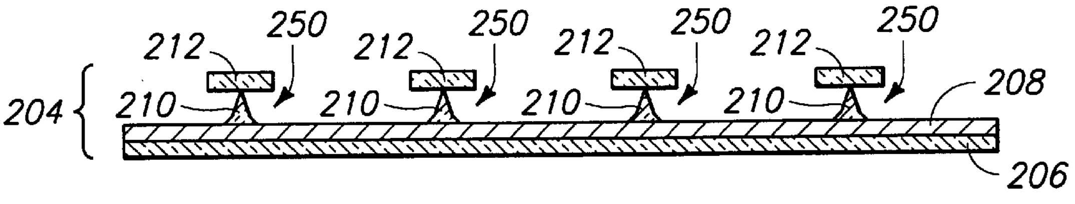
FIG. 10 is a view of the FIG. 5 semiconductor substrate shown at a processing step subsequent to that of FIG. 9.

Referring to FIG. 10, substrate 204 is subjected to an etch to form conically shaped emitters from the conductive material of layer 210. In embodiments in which such conductive material comprises conductively doped polysilicon, the etch can comprise, for example, a silicon dry etch utilizing $SF_6$ and helium.

Figure 1:
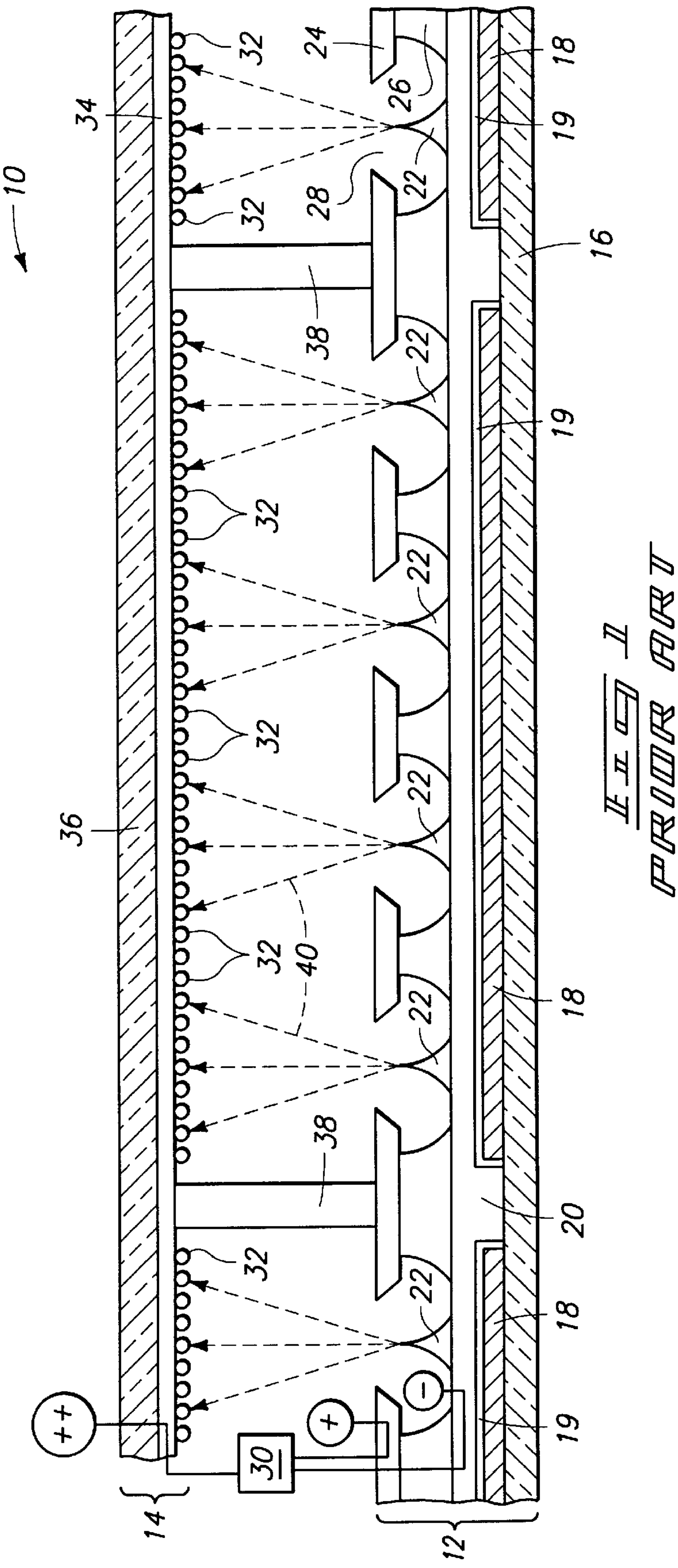
FIG. 1 PRIOR ART
FIG. 1 is a diagrammatic, fragmentary, cross-sectional view of a prior art FED device.

In subsequent processing (not shown), layer 212 can be selectively removed relative to material 210, and emitters 250 can be incorporated into an emission display device, such as, for example, the device of FIG. 1. In embodiments in which layer 212 comprises silicon dioxide and layer 210 comprises conductively doped polysilicon, layer 212 can be selectively removed relative to the polysilicon of layer 210 utilizing, for example, a silicon dioxide etch utilizing one or both of $CF_4$ and $CHF_3$.

The methodology of pressing mold 104 onto layer 214 (described above with reference to FIGS. 5 and 6) can be accomplished by numerous processes which will be recognized by persons of ordinary skill in the art. For instance, mold 104 can be pressed downwardly toward substrate 202 utilizing a pressing disk analogous to the disk described with reference to FIG. 2. Such disk could be pressed downwardly by mechanical means (such as, for example, hydraulic and/or electrical mechanisms) coupled with the disk and configured to press the disk toward substrate 202. Alternatively, mold 104 could be pulled downwardly with a vacuum. An exemplary method for pulling mold 104 downwardly with a vacuum is described with reference to FIG. 11. In referring to FIG. 11, similar numbering to that utilized above in describing FIGS. 2–10 will be used, with differences indicated by different numerals.

Figure 11:
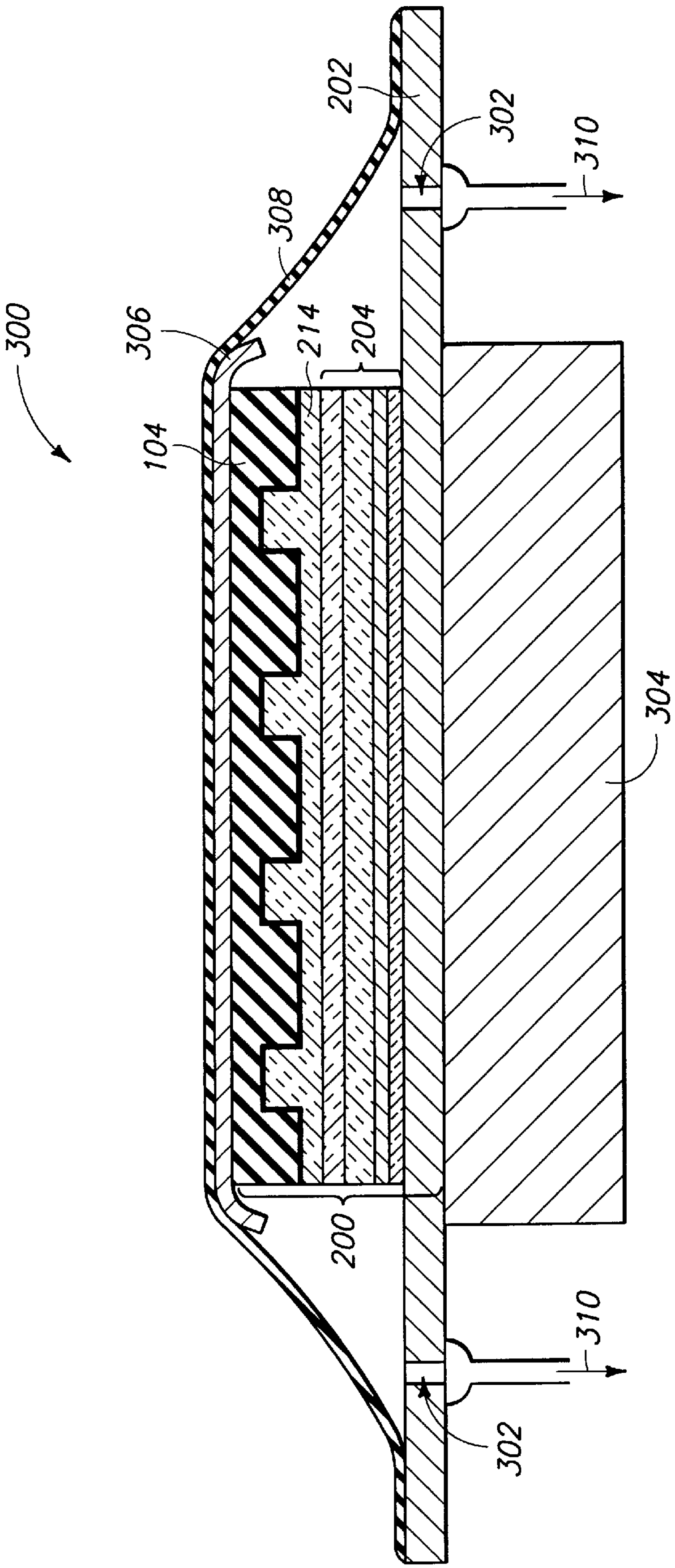
FIG. 11 is a diagrammatic, cross-sectional view of an apparatus being utilized to process a semiconductor substrate in accordance with a method of the present invention.

FIG. 11 shows an apparatus 300 comprising the assembly 200. Such assembly includes a support 202, a semiconductor substrate 204, a masking material layer 214, and a mold 104.

Support 202 has orifices 302 formed therein. Although the exemplary shown support 202 comprises two orifices extending therethrough, it is to be understood that other embodiments of the invention are contemplated wherein only one orifice is provided through support 202, or wherein more than two orifices are provided. Support 202 can comprise, for example, aluminum. A heater 304 is provided beneath support 202 and configured to provide heat through support 202 to substrate 204 and mask material 214.

A plate 306 is provided over mold 104, and a flexible material 308 is provided over plate 306. Plate 306 can comprise a solid plate, or can comprise a plate having a number of orifices formed therethrough (a screen). Flexible material 308 can comprise, for example, rubber. In operation, a vacuum (illustrated by arrows 310) is applied to orifices 302 and utilized to pull flexible material 308 toward support 202. Such pulling of flexible material 308 is utilized to force mold 104 into material 214. Plate 306 is provided to uniformly distribute the force applied through flexible material 308 to a surface of mold 104.

The pressures utilized to force mold 104 into material 214 can vary depending on the compositions of mold 104 and material 214, as well as on the pliability of material 214. In an exemplary embodiment in which material 214 comprises EPON SU8™, and in which such material is heated to a temperature of at least about 83° C., and further wherein mold 104 comprises silicon rubber, a suitable pressure for forcing mold 104 into material 214 is about 14 pounds per square inch (psi). In a particular embodiment, vacuum 310 can be utilized to provide an absolute pressure of 14.7 psi, which translates into a pressure of about 14 psi in an internal space under flexible material 308.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor device, comprising:

forming a masking material over a semiconductor substrate;

providing a mold having a first pattern defined by projections and valleys between the projections;

pressing the masking material between the mold and the substrate to form a second pattern in the masking material, the second pattern being substantially complementary to the first pattern;

removing the mold from the masking material; and after removing the mold, utilizing the masking material as a mask during etching of the semiconductor substrate.

2. The method of claim 1 wherein the masking material comprises a material that is relatively pliable under a first condition, and relatively solid under a second condition, the method further comprising:

pressing the masking material while subjecting the masking material to the first condition; and after the pressing, subjecting the masking material to the second condition.

3. The method of claim 2 wherein the masking material is subjected to the second condition before the mold is removed from the masking material.

4. The method of claim 1 wherein the masking material comprises a thermoplastic material.

5. The method of claim 1 wherein the masking material comprises a material that is relatively pliable at a first temperature and relatively solid at a second temperature, the method further comprising:

pressing the masking material while the masking material is at the first temperature; and after the pressing, changing the temperature of the masking material to the second temperature.

6. The method of claim 5 wherein the temperature of the masking material is changed to the second temperature before the mold is removed from the masking material.

7. The method of claim 5 wherein the second temperature is higher than the first temperature.

8. The method of claim 1 wherein the semiconductor substrate comprises a layer of first material over a semiconductive material, the first material being selectively etchable relative to the semiconductive material, and wherein the etching of the semiconductor substrate comprises:

etching the layer of first material while utilizing the masking material as a mask to form a second mask comprising the etched first material; and etching the semiconductive material while masking the semiconductive material with the second mask.

9. The method of claim 8 wherein the masking material is removed after forming the second mask and before the etching of the semiconductive material.

10. The method of claim 1 wherein the mold comprises a hardened polymer.

11. The method of claim 1 wherein the mold comprises silicon rubber.

12. The method of claim 1 further comprising providing a release layer between the mold and the masking material, the release layer alleviating sticking of the masking material to the mold during the removing of the mold.

13. The method of claim 1 wherein the pressing comprises:

placing the substrate on a support, the support having at least one orifice extending therethrough;

placing a flexible material over the mold and over the at least one orifice; and pulling a vacuum through the orifice and on the flexible material to pull the flexible material toward the support and accordingly press the mold between the flexible material and the support.

14. The method of claim 13 further comprising heating the support and transferring heat from the support to the substrate and masking material during the pressing.

15. A method of forming a semiconductor device, comprising:

forming a conductively doped silicon material;

forming a masking material over the conductively doped silicon material;

providing a mold over the masking material;

pressing the masking material between the mold and the conductively doped silicon material to pattern the masking material; and transferring the pattern from the patterned masking material to the underlying conductively doped silicon material to define features of a semiconductor device.

16. The method of claim 15 wherein the masking material comprises a material that is relatively pliable under a first condition, and relatively solid under a second condition, the method further comprising:

pressing the masking material while subjecting the masking material to the first condition; and after the pressing, subjecting the masking material to the second condition.

17. The method of claim 16 wherein the masking material is subjected to the second condition before the mold is removed from the masking material.

18. The method of claim 15 wherein the masking material comprises a material that is relatively pliable at a first temperature and relatively solid at a second temperature, the method further comprising:

pressing the masking material while the masking material is at the first temperature; and after the pressing, changing the temperature of the masking material to the second temperature.

19. The method of claim 18 wherein the temperature of the masking material is changed to the second temperature before the mold is removed from the masking material.

20. The method of claim 18 wherein the second temperature is higher than the first temperature.

21. The method of claim 15, further comprising:

forming a silicon dioxide layer over the conductively doped silicon material;

forming the masking material over the silicon dioxide layer;

transferring the pattern from the patterned masking material to the silicon dioxide to form a plurality of openings extending through the silicon dioxide layer and to the underlying conductively doped silicon material; and transferring the pattern from silicon dioxide to the underlying conductively doped silicon material to define the features of the semiconductor device.

22. The method of claim 21, further comprising removing the patterned masking material prior to transferring the pattern from silicon dioxide to the underlying conductively doped silicon material.

23. A method of forming a field emission display, comprising:

forming a first material layer over a conductive substrate;

forming a masking material over the first material layer;

providing a mold over the masking material;

pressing the masking material between the mold and the first material layer to pattern the masking material;

transferring the pattern from the patterned masking material to the first material layer to form a second mask comprising the patterned first material layer;

utilizing the second mask to protect portions of the conductive substrate during an etch while leaving other portions of the conductive substrate exposed to the etch, the etch forming a plurality of conically shaped emitters from the conductive substrate; and forming a display screen spaced from said emitters.

24. The method of claim 23 wherein the first material layer comprises silicon dioxide.

25. The method of claim 23 wherein the masking material comprises a material that is relatively pliable under a first condition, and relatively solid under a second condition, the method further comprising:

pressing the masking material while subjecting the masking material to the first condition; and after the pressing, subjecting the masking material to the second condition.

26. The method of claim 23 wherein the masking material comprises a material that is relatively pliable at a first temperature and relatively solid at a second temperature, the method further comprising:

pressing the masking material while the masking material is at the first temperature; and after the pressing, changing the temperature of the masking material to the second temperature.

27. The method of claim 23, further comprising removing the patterned masking material prior to etching the conductive substrate.

28. The method of claim 23 wherein the conductive substrate comprises conductively doped polysilicon.

29. The method of claim 23 wherein the conductive substrate comprises conductively doped amorphous silicon.

* * * * *